United States Patent
Simovski

(10) Patent No.: US 9,252,303 B2
(45) Date of Patent: Feb. 2, 2016

(54) THIN FILM PHOTOVOLTAIC CELL STRUCTURE, NANOANTENNA, AND METHOD FOR MANUFACTURING

(75) Inventor: Constantin Simovski, Kirkkonummi (FI)

(73) Assignee: Aalto University Foundation, Espoo (FI)

( * ) Notice: Subject to any disclaimer, the term of this patent is extended or adjusted under 35 U.S.C. 154(b) by 66 days.

(21) Appl. No.: 14/005,531

(22) PCT Filed: Mar. 16, 2012

(86) PCT No.: PCT/FI2012/050250
§ 371 (c)(1),
(2), (4) Date: Nov. 25, 2013

(87) PCT Pub. No.: WO2012/123645
PCT Pub. Date: Sep. 20, 2012

(65) Prior Publication Data
US 2014/0158198 A1 Jun. 12, 2014

(30) Foreign Application Priority Data
Mar. 16, 2011 (FI) .................................. 2011050227

(51) Int. Cl.
*H01L 31/0232* (2014.01)
*B82Y 20/00* (2011.01)
(Continued)

(52) U.S. Cl.
CPC ........... *H01L 31/02327* (2013.01); *B82Y 20/00* (2013.01); *G02B 5/008* (2013.01); *H01L 31/0392* (2013.01); *H01L 31/0543* (2014.12); *Y02E 10/52* (2013.01)

(58) Field of Classification Search
CPC .................................................. H01L 31/02327
USPC .............................................. 136/259; 438/69
See application file for complete search history.

(56) References Cited

U.S. PATENT DOCUMENTS 7,423,254 B2 * 9/2008 Arend et al. ................ 250/214.1
7,754,964 B2 * 7/2010 Kempa et al. .................. 136/255
(Continued)

FOREIGN PATENT DOCUMENTS

EP 0450881 A2 10/1991
EP 2109147 A1 10/2009
(Continued)

OTHER PUBLICATIONS

Publication of WO 2012/123645 A3 with International Search Report dated Jan. 10, 2013 and published Mar. 14, 2013 for PCT/FI2012/050250.
(Continued)

*Primary Examiner* — Golam Mowla
(74) *Attorney, Agent, or Firm* — Koppel, Patrick, Heybl & Philpott

(57) ABSTRACT

A thin film photovoltaic cell structure (1) comprises a substrate (2); a first dielectric layer (3) on the substrate (2); an active layer (4) on the first dielectric layer (3); and a plasmonic light concentrator arrangement (5) on the active layer (4) for coupling incident light at a first wavelength band into the active layer (4). According to the present invention, the thin film photovoltaic cell structure (1) further comprises a second dielectric layer (6) formed of a dielectric material which is transparent at the first wavelength band and at a second wavelength band on the plasmonic light concentrator arrangement (5); the first dielectric layer (3), the active layer (4), the plasmonic light concentrator arrangement (5), and the second dielectric layer (6) being configured to form a resonant cavity for coupling incident light at the second wavelength band into a standing wave confined in the resonant cavity.

12 Claims, 6 Drawing Sheets

(not in scale)

(51) Int. Cl.
*G02B 5/00* (2006.01)
*H01L 31/0392* (2006.01)
*H01L 31/054* (2014.01)

(56) References Cited

U.S. PATENT DOCUMENTS 8,003,427 B2 * 8/2011 Faraone et al. ............... 438/69
8,853,530 B2 * 10/2014 Ozaki et al. ................ 136/259

FOREIGN PATENT DOCUMENTS

WO    WO 2010028358 A2    3/2010
WO    WO 2010121189 A2    10/2010

OTHER PUBLICATIONS

Publication of WO 2012/123645 A9 with revised International Search Report dated Jan. 10, 2013 and published May 2, 2013 for PCT/FI2012/050250.

International Search Report for PCT/FI2011/050227 dated Dec. 22, 2011.

Kinzel, E.C., et al.: "Periodic Arrays of Ridge Apertures as a High Efficiency Coupler for Photovoltaic Applications", Next Generation (Nano) Photonic and Cell Technologies for Solar Energy Conversion Aug. 1-4, 2010 San Diego, CA USA, vol. 7772, Jan. 1, 2011 (XP002677560), Proceedings of the SPIE—The International Society for Optical Engineering SPIE—The International Society for Optical Engineering USA Sections "1. Introduction", "2. Numerical study", figures 1-9.

Pillai, S., et al.: "Surface Plasmon Enhanced Silicon Solar Cells", Journal of Applied physics, American Institurte of Physics. New York, US, vol. 101, No. 9, May 7, 2007 pp. 93105-093105 (XP012098459).

US Publication No. 2010/308428 A1 (Okamoto Daisuke et al), published Dec. 9, 2010.

Schantz, H.G.: "Planar Elliptical Element Ultra-Wideband Dipole Antennas", IEEE Antennas and Propagation Society International Symposium (IEEE CAT. No. 02CH37313 IEEE Piscataway, NJ USA vol. 3, 2002, pp. 44-+47, vol. 3 (XP002689284).

US Publication No. 2007/235635 A1 (Arend Mark, et al.), dated Oct. 11, 2007.

US Publication No. 2009/008735 A1 (Ogino Masaya, et al.), dated Jan. 8, 2009.

Tsai et al.: "The Low-Loss Plasmonic Mode for Light Confinement in Silicon-Based Thin-Film Solar Cells". In: Proceedings of the $35^{th}$ IEEE Photovoltaic Specialists Conference. IEEE 2010, p. 1581-1585.

International Preliminary Report on Patentability (PCT/IPEA/409) for PCT/FI2012/050250 mailed Sep. 24, 2013.

Communication to the International Preliminary Examination Authority (IPEA) for PCT/FI2012/050250 dated Apr. 10, 2013.

* cited by examiner

Fig. 1 (not in scale)

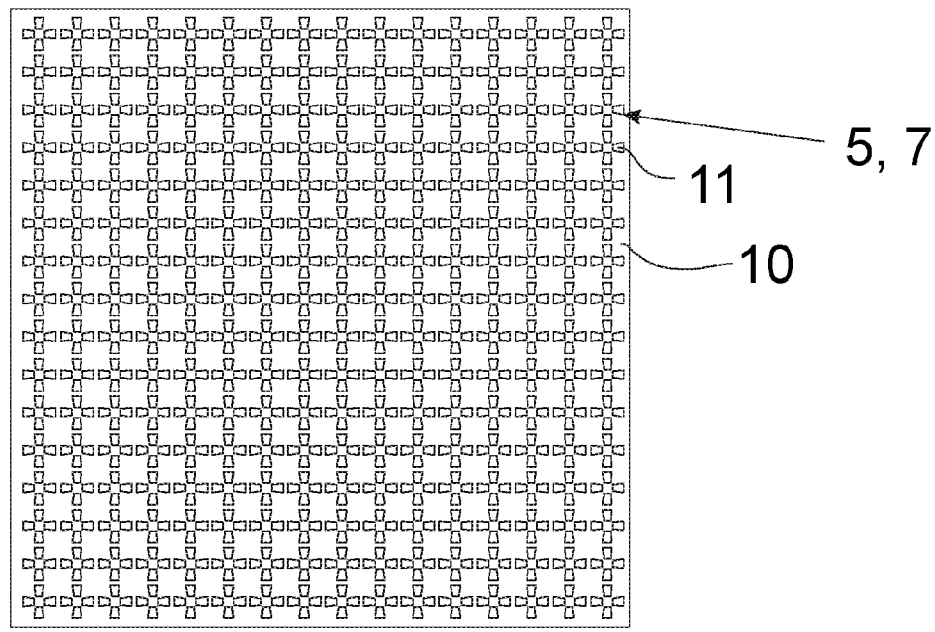
Fig. 2
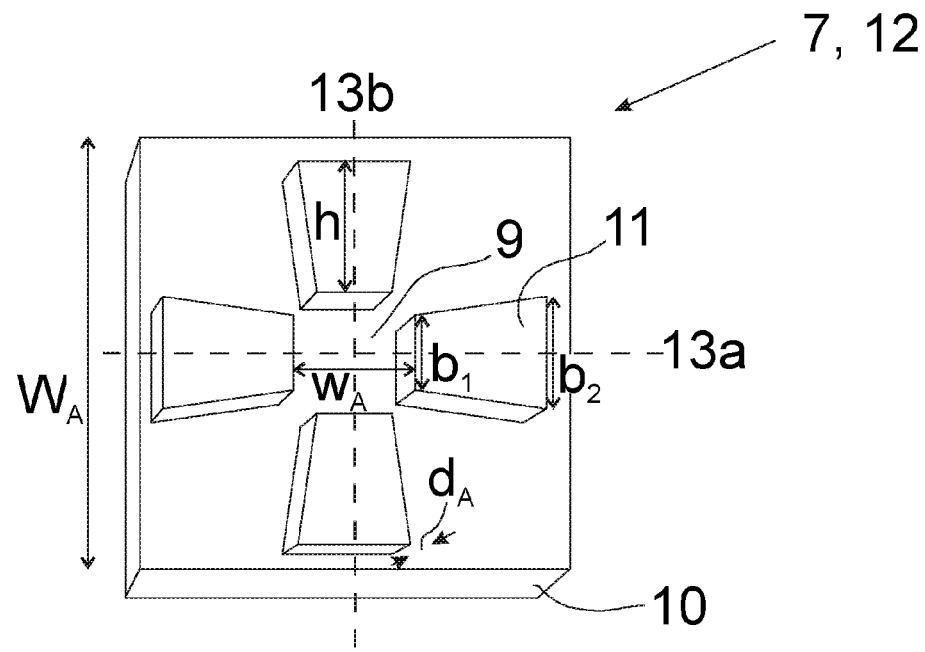
Fig. 3 (not in scale)

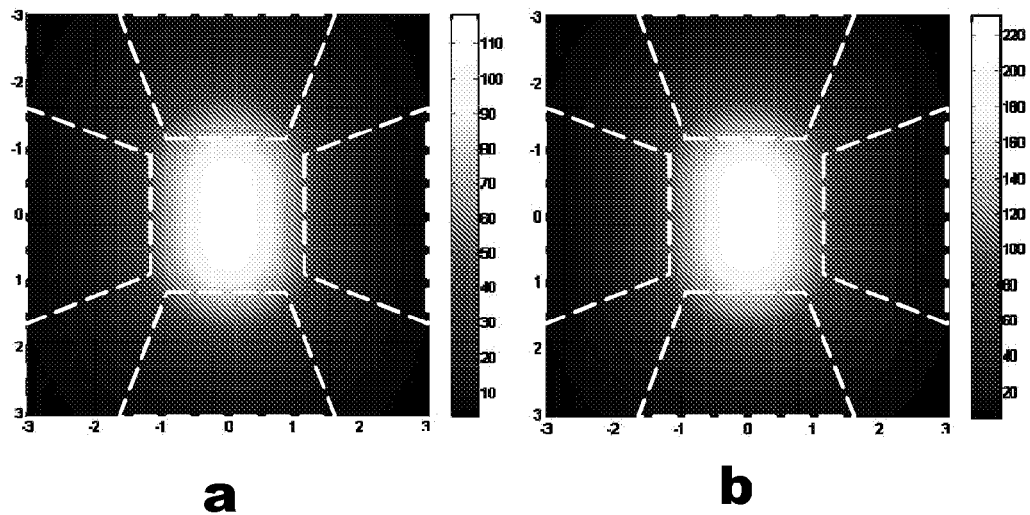
Fig. 4
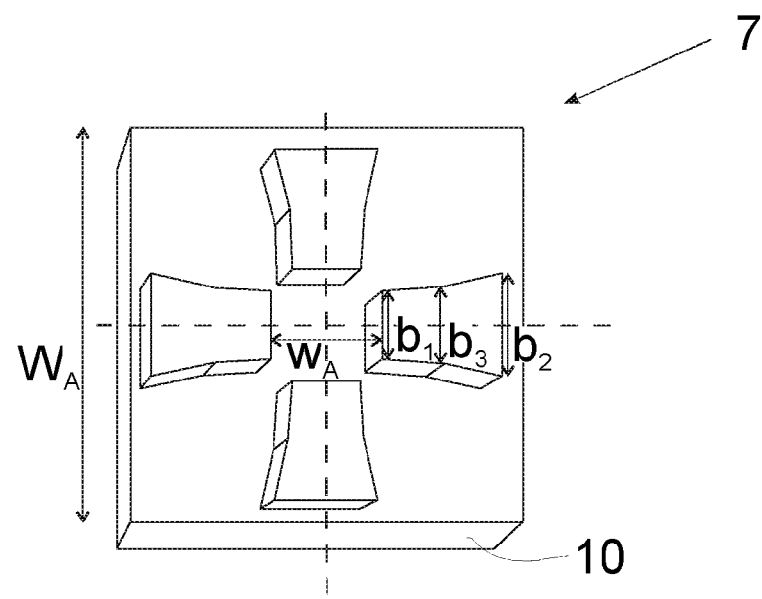
Fig. 5 (not in scale)

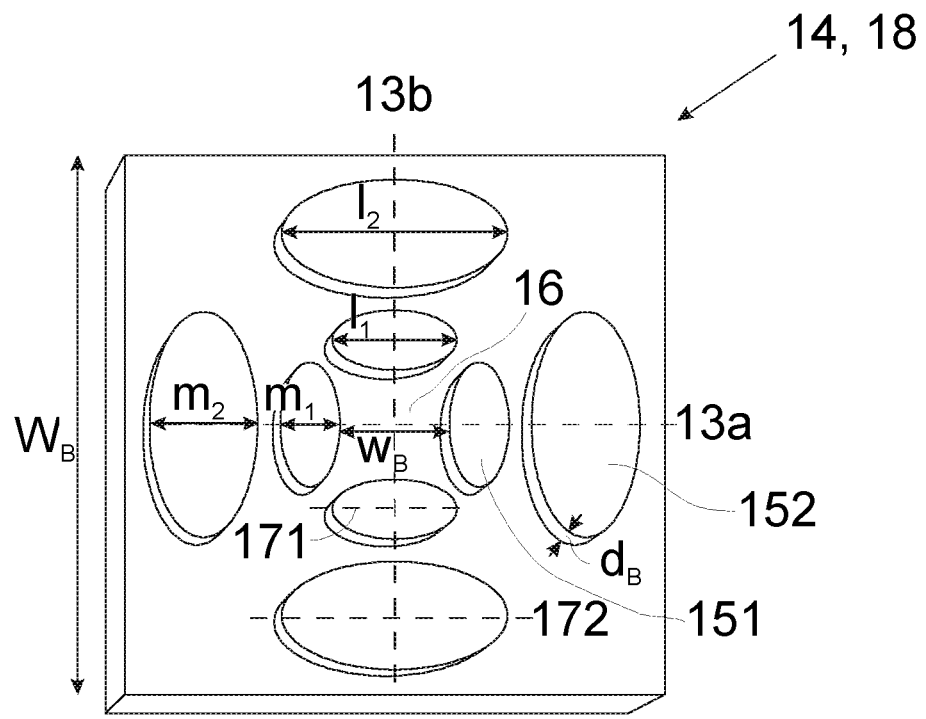
Fig. 6 (not in scale)
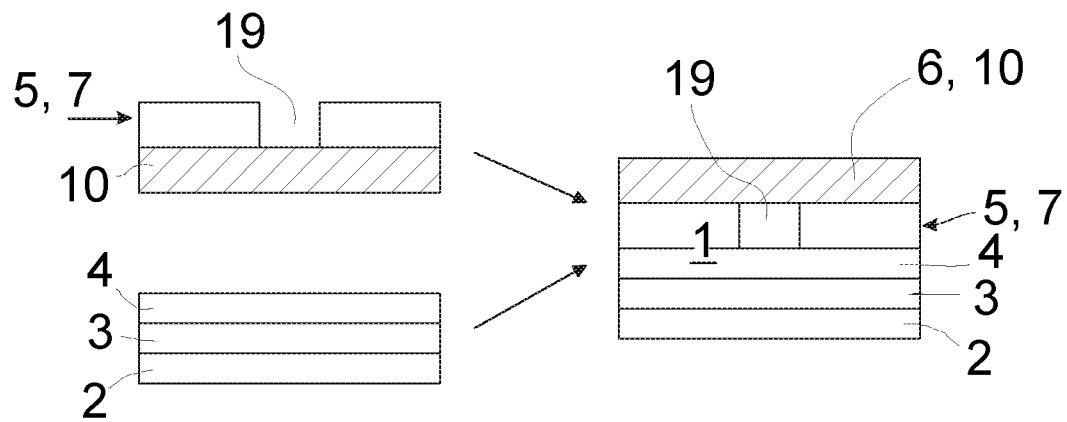
Fig. 7 (not in scale)

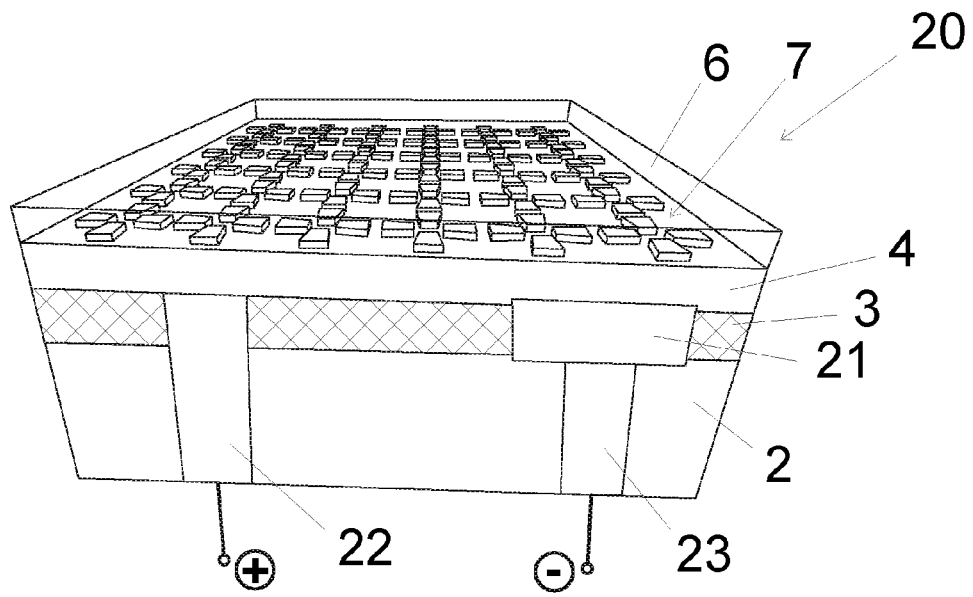
Fig. 8 (not in scale)
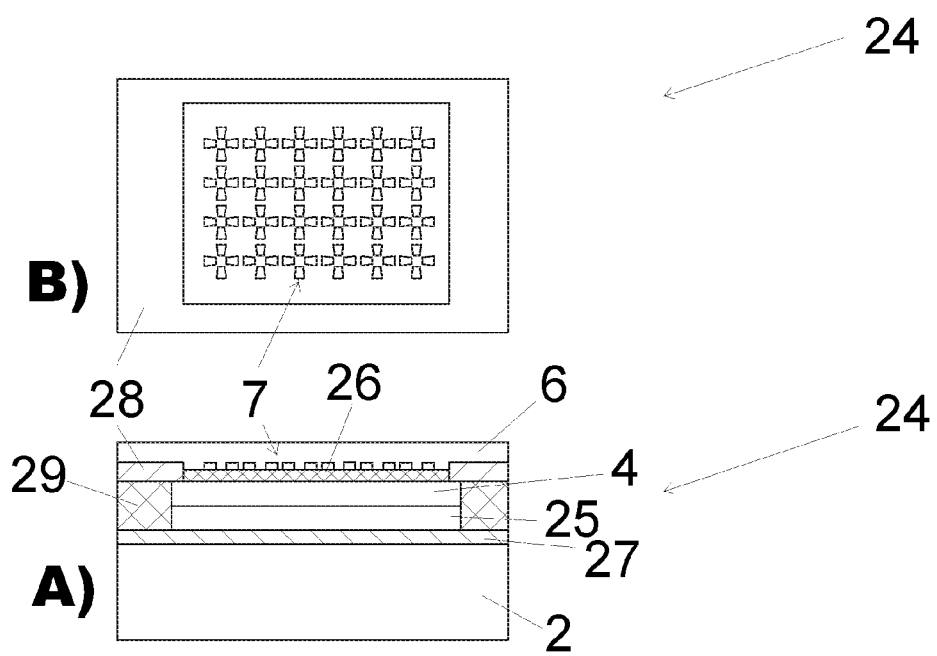
Fig. 9 (not in scale)

THIN FILM PHOTOVOLTAIC CELL STRUCTURE, NANOANTENNA, AND METHOD FOR MANUFACTURING

FIELD OF THE INVENTION

The present invention relates to thin film photovoltaic cells, particularly to plasmon-enhanced thin film photovoltaic cells. The present invention also relates to nanoantennas for plasmonic light concentrator arrangements for thin film photovoltaic cells. The present invention further relates to manufacturing of plasmon-enhanced photovoltaic cells.

BACKGROUND OF THE INVENTION

Photovoltaic cells are used in a great variety of applications to convert electromagnetic radiation, e.g. the solar radiation, to electrical energy.

By a photovoltaic cell is meant here generally a semiconductor-based component converting incident electromagnetic radiation to electrical energy through a photovoltaic effect. In the case of solar radiation as the primary energy source, a photovoltaic cell is usually called a solar cell. In general, a photovoltaic cell comprises a p-type semiconductor region, an n-type semiconductor region, and an active region. The n-type and p-type semiconductor regions form a pn-junction. Photons of incident light having energy equal to or greater than the band gap energy of the active region material are absorbed, thereby generating free electrons and holes in the active material. These free charge carriers are then collected by means of electrodes connected to the different sides of the pn-junction.

One promising technological trend within the photovoltaic cell development is the field of thin film cells. In thin film photovoltaic cells the semiconductor layers of the device are realized as thin layers with a thickness in a range from a few nanometers to some tens of micrometers. Thin film cells can provide advantages in the energy conversion efficiency and in the manufacturing costs. Decreased layer thicknesses also mean lower weight of the cells and the solar panels formed of them. A thin overall structure enables also flexible device configurations. The active layer material of a thin film cell can be e.g. p-doped amorphous silicon or gallium arsenide.

In a photovoltaic cell, before any energy conversion can take place, light has to enter the cell and penetrate to the active region. Thus, losses due to reflection, scattering, and absorption before the active region should be minimized. Moreover, having reached the active region, the light energy should be absorbed there as effectively as possible without passing through it or reflecting back out of the cell. This is an important issue in all photovoltaic cell configurations. In thin film cells where the active region typically is a layer having a thickness in a range of only tens of nanometers to some micrometers, effective capturing of light energy into the active region becomes a key factor for the overall efficiency of the cell. On the other hand, light capturing solutions used with conventional thick film cells, e.g. different surface textures for coupling the incident light into the cell, are usually not suitable for thin film configurations.

Thus, intensive effort is focused in the field of thin film photovoltaic cells on research and development of more and more efficient solutions to improved light capturing.

Recently, one of the most active research areas has been the different forms of plasmonic light concentrators (LC) based on plasmonic nanoparticles arranged in an array on the surface of a photovoltaic cell on the side of the incident light. The operation of plasmonic nanoparticles (PNP) is based on resonant excitation of surface plasmons by the incident light. With suitable configuration of the nanoparticles and proper structural connection between the nanoparticles and the active region of the cell, the plasmon resonance, i.e. resonant oscillation of the electrons in the nanoparticles, results in efficient coupling of incident light into the active region. In this coupling, the light energy in the incident plane wave is concentrated into a plurality of so called hot spots located at least partially within the active region of the cell. At the same time, reflection backwards from the active region as well as transmission through it is minimized.

Many of the recently reported research activities in the field of plasmonic light concentrators are focused on metallic nanoparticles located on top of a thin film solar cell and covered. The metallic nanoparticles can be randomly distributed separate particles of silver or gold. These kinds of nanoparticles for light coupling are disclosed e.g. in US 2009/0250110 A1. Alternatively, a plasmonic light concentrator can be implemented as an array of regular two-dimensional nanoparticles like nanostrips as disclosed e.g. in EP 2109147 A1. The theory and principles of operation of both types of those nanoparticles and variations thereof are widely discussed in the scientific literature.

Common for both randomly organized nanoparticles and regularly arranged two-dimensional nanoparticles is that the wavelength/frequency band of the plasmonic enhancement is relatively narrow. With randomly distributed nanoislands, typically no more than about 10% of the wavelength/frequency band where photovoltaic conversion can take place in the active region is covered. With an array of nanostrips, the double-frequency operation due to two quadrupole plasmon resonances can typically provide a maximal coverage of about 20% of the available photovoltaic wavelength/frequency band. Forming a light concentrator as a double-periodic grid of nanostrips can increase the efficiency via the multi-frequency resonance thereby achieved up to half of the useful photovoltaic band.

So called nanoantennas (NA) arranged as an array on a photovoltaic cell provide an alternative way to implement plasmonic light concentrator arrangements. In a nanoantenna, the hot spot is created not due to excitation of a collective mode in the regular grid (called surface plasmon polariton) as is the case in a regularly arranged array of two-dimensional nanoparticles, but due to excitation of the eigenmodes of the antenna unit (called localized surface plasmons). Naturally, the plasmon resonance is influenced to some extent by the electromagnetic interaction between the neighboring antennas of the array, but the major factor is anyway the configuration of a single nanoantenna. One known nanoantenna configuration is the bow-tie nanoantenna consisting of two oppositely placed substantially triangular nanopatches. The local field at the plasmon resonance is concentrated in the gap between the apexes of the triangles. The center of this hot spot is located inside the substrate on which the nanoantennas are formed. The displacement of the hot spot into the substrate results from its higher permittivity compared to that of the free space. Another known nanoantenna type is the dimer type configuration comprising two adjacent circular nanopatches. The design and operation principles of both bow-tie and dimer type nanoantennas are widely discussed in the scientific literature.

An important feature of nanoantennas is that any strict antenna array regularity is not required. Moreover, single antenna units are not very sensitive to the manufacturing tolerances thereof. The more tolerant geometrical dimensions of a nanoantenna array allow use of manufacturing equipment with lower cost than e.g. the electron or ion beam lithography usually required for manufacturing regularly distributed arrays of two-dimensional plasmonic nanoparticles. Thus, from industrial-scale manufacturing point of view, nanoantennas provide a very promising approach to implement plasmon enhanced photovoltaic cells. On the other hand, also the known nanoantenna configurations suffer from a narrow wavelength/frequency band of the plasmon resonance. For bow-tie antennas, the dipole-type resonance band typically covers only about 5% of the available band of the photovoltaic effect.

As an approach entirely different from the plasmonic light concentrators, it is known to enhance the light capturing efficiency of a photovoltaic cell by placing the active region within a resonant cavity, usually called a standing wave Fabry-Perot resonant cavity. In general, such a resonant cavity is formed by two refracting, substantially lossless layers located at opposite sides of the active region to serve as reflecting end elements of the cavity. The cavity is designed to form a standing wave confined in the thus formed cavity. Resonance enhances the optical field within the active region and thus increases the light capturing efficiency. The energy which is absorbed in the active region is reimbursed by the incident light flux. A standing wave Fabry-Perot cavity can be manufactured with lower costs than e.g. the more complicated regular plasmonic light concentrators. However, the light capturing enhancement covers again a very narrow portion of the available wavelength/frequency range of the photovoltaic effect, typically 5-7%. More broadband standing wave Fabry-Perot type cavities are also known. However, they comprise complex multilayer structures located on both sides of the active photovoltaic region, the multilayer structures necessitating nanometer-scale precision of manufacture. The costs of such cavities are comparable with the costs of the regular plasmonic light concentrators, thus making them unsuitable for use in typically very cost-critical thin-film solar cells.

As is clearly seen in the prior art description above, there is a strong demand in the field of thin film photovoltaic cell structures for more efficient light capturing solutions which, preferably, could be manufactured with reasonable manufacturing costs.

OBJECT OF THE INVENTION

The object of the present invention is to provide a thin film photovoltaic cell structure with improved light capturing efficiency and enabling cost-efficient industrial-scale manufacturing. Another object of the present invention is to provide a nanoantenna which is suitable, for example, for use in such thin film photovoltaic cell structures. It is also an object of the present invention to provide a cost-efficient method for manufacturing such thin film photovoltaic cells.

SUMMARY OF THE INVENTION

The above objects are achieved by the present invention characterized by what is presented in the claims.

According to a first aspect, the present invention is focused on a thin film photovoltaic cell structure comprising a substrate; a first dielectric layer on the substrate; an active layer on the first dielectric layer for generating free charge carriers via a photovoltaic effect; and a plasmonic light concentrator arrangement on the active layer for coupling incident light at a first wavelength band into the active layer.

By a thin film photovoltaic cell structure is meant here a structure forming at least a part of a thin film photovoltaic cell. By a thin film photovoltaic cell, in turn, is meant here a photovoltaic cell in which at least the active layer where the actual photovoltaic effect, i.e. the generation of free charge carriers via absorption of incident light energy, takes place is in the form of a layer having a thickness in the range from a few nanometers to some tens of micrometers, typically from tens of nanometers to a few micrometers. The active layer can be formed of any material and structure suitable in the form of a thin film for photovoltaic conversion. It can comprise e.g. p-doped amorphous silicon, or polycrystalline silicon or gallium arsenide.

Thus, the separation of the terms "cell" and "cell structure" means that a complete thin film photovoltaic cell may comprise, in addition to the actual thin film photovoltaic cell structure, any additional structures and elements required for constructing a complete, workable device. Such additional structures and elements typically comprise, for example, electrodes providing electrical connections between the active layer and external electrical circuits.

The basic configuration of the thin film cell structure of the present invention can be based on the conventional layer structure with superposed p- and n-type semiconductor layers for forming a pn-junction, and an active layer being formed between these two layers. However, the basic configuration of the cell utilizing the cell structure according to the present invention can as well be the next generation lateral one having the p- and n-type semiconductor regions at the sides of an active region formed within the active layer.

Further, by a photovoltaic cell is meant here a functional unit which can form the core portion of one discrete photovoltaic device or component. Also, the photovoltaic cell comprising an active layer can be an integrated and inseparable portion of a larger photovoltaic assembly.

A plasmonic light concentrator arrangement is an arrangement for coupling light into the active region by means of excitation of plasmonic resonance by the incident light. As described in the background section, such light concentrators include randomly and regularly arranged arrays of plasmonic nanoparticles as well as plasmonic nanoantennas.

According to the present invention, the thin film photovoltaic cell structure further comprises a second dielectric layer on the plasmonic light concentrator arrangement. The second dielectric layer is formed of a material which is transparent at the first wavelength band and at a second wavelength band. Moreover, the first dielectric layer, the active layer, the plasmonic light concentrator arrangement, and the second dielectric layer of the cell are together configured to form a resonant cavity suitable for coupling incident light at the second wavelength band into a standing wave confined in the resonant cavity, preferably so that the maximum of this standing wave is located inside the active layer.

The requirements for the material of the first dielectric layer are discussed in more detail in the detailed description. In general, it is to be noted that because the purpose of the dielectric nature of this layer primarily relates to the optical operation thereof as a part of the resonant cavity, the first dielectric layer can be made of any material suitable for this purpose. As discussed in the detailed section, the material of this layer can be, in addition to those purely dielectric materials, also some semiconductor with suitable relative permittivity and sufficiently low absorption losses.

Thus, it is one of the core principles of the present invention to combine into a single thin film cell structure both a plasmonic light concentrator arrangement operating at a first wavelength band and a Fabry-Perot type standing wave resonant cavity operating at a second wavelength band. This combination of two different light coupling arrangements and thus two wavelength bands of enhanced light coupling into the active layer enables an enhanced light capturing efficiency over a broad wavelength range. Preferably, to maximize said effect of broad wavelength range of improved light capturing efficiency, and to allow separate optimization of operation of the two different light coupling arrangements, the second wavelength band is separate from the first wavelength band. In other words, at least the middle points of these wavelength bands are clearly separated from each other. Most preferable, those two bands, i.e. the wavelength bands where the plasmonic resonance and the Fabry-Perot resonance have observable effects on the light capturing efficiency, are truly separate without any overlap.

The enhanced overall light capturing efficiency of the photovoltaic cell structure according to the present invention is achieved not just by combining into a single device two separate light coupling arrangements. Instead, it is the overall configuration of the entire cell structure which serves to provide the operations of the two different light coupling arrangements. The second dielectric layer is the only additional element needed with respect to the known plasmon-enhanced cells. On the other hand, those known cells also usually comprise some protective layer on the plasmonic light concentrator arrangement. In comparison to that, in the invention this layer of the cell is just configured to operate, in addition to those protective purposes, also as a part of the resonant cavity.

It is, naturally, essential for the intended operations of those two light coupling arrangements that the optical performance of the photovoltaic cell structure and each element thereof is carefully adjusted. In other words, the materials and thicknesses of the different layers as well as the detailed configuration of the plasmonic light concentrator arrangement must be selected properly according to the desired optical operation. No detailed parameters of the different layers can be defined here because of the great possibility of variations e.g. in the materials of the different layers and the desired wavelength bands. However, designing the cell configuration according to the desired optical performance is kind of routine engineering for a person skilled in the art. In other words, given the basic principle of the invention, a person skilled in the art in the field of designing thin film photovoltaic cells is able properly to select the details of the cell structure based on the common general knowledge and the prior art disclosures available in the literature.

The first and the second wavelength bands can be adjusted e.g. to the near infrared (NIR) and to the visible ranges of the electromagnetic spectrum, respectively. This is an efficient embodiment particularly for solar applications. In some embodiments, it is preferable that the adjustment of those two wavelength bands is performed so that the local field enhancement within the active layer is maintained substantially continuously over a broad frequency range covering part of the visible range and part of the near infrared range. Though thin-film solar cells are usually designed to operate in the visible range, and the near infrared solar radiation is wasted in them, it can be reasonable to complement in solar collectors the usual solar cells operating in the visible range by those operating in the near infrared. For example, this applies when the solar light is preliminarily concentrated by lens concentrators.

In a preferred embodiment, the plasmonic light concentrator arrangement comprises a nanoantenna for concentrating the incident light at the first wavelength band into a spot extending into the active layer, preferably so that as large a portion as possible of the spot lies within the active layer. As described above in the background section, nanoantennas provide significant advantages over the randomly or regularly distributed nanoparticles in the less strict design and manufacturing tolerances of the nanostructures. Moreover, in contrast to the very narrow resonance band produced by collective oscillation in a regularly arranged array of two-dimensional nanoparticles (surface plasmon polariton), the plasmon resonance produced by a nanoantenna generally occurs over a much broader wavelength range.

By the spot into which the nanoantenna scatters the incident light energy at the resonance wavelengths is meant here a sub-wavelength spatial region whose effective thickness is equal to or less than the thickness of the active photovoltaic layer. In the art, this spot is commonly called a "hot spot". As yet another essential advantage achieved by the use of nanoantennas instead of other type plasmonic light concentrator arrangements, the hot spot of a nanoantenna, i.e. the volume where the local field enhancement takes place, is formed mainly outside of the metallic nanoantenna structure itself. With a proper configuration of the thin film photovoltaic cell structure, the hot spots can be concentrated very efficiently to the active photovoltaic layer only. In contrast, e.g. in plasmonic light concentrators based on a regular array of metal nanoparticles, the hot spots are mainly located inside the metal nanoparticles, thereby causing high losses and heating of the nanoparticles.

In the nanoantenna based approach, the plasmonic light concentrator arrangement comprises preferably a nanoantenna which is configured to provide multiple plasmon resonance wavelengths within the first wavelength band. Several plasmon resonances at different, possibly partly overlapping wavelength sub-ranges together form a combined operation band which can be much broader than that of nanoantennas with only one effective resonance.

The conventional multi-frequency plasmonic nanoantennas are based on a combination of several separate antenna units, one for each desired frequency, forming a unit cell of the antenna. This unit cell is then repeated to form a larger antenna array. The separate antenna units of the unit cell can comprise antenna units of the same type with different sizes, antenna units of different types, or antenna units differing from each other both in their types and sizes. For example, a unit cell of a multi-frequency antenna can be formed of a combination of dimer type and bow-tie antenna units.

The unit cell of several separate antenna units necessarily has a rather large area. When the size of the unit cell becomes large in comparison to the wavelength of incident light, parasitic reflection from the periodic antenna array to two Fraunhofer maxima takes place, thus making the coupling efficiency of the antenna array sensitive to the direction of the incident light. In other words, the antenna array then works efficiently for perpendicular incidence, i.e. for a zero angle of incidence only. Moreover, even for this normal incidence, an antenna having a width substantially larger than the wavelength of the incident light forms a hot spot with a thickness easily exceeding the typical thickness of the photovoltaic layer in a thin-film solar cell. Then, the transmitted wave extends outside the photovoltaic layer, and a significant part of the incident light energy will be lost in the substrate layer(s) below the photovoltaic layer.

To avoid the above problems, according to a second aspect, the present invention is focused on a nanoantenna with multiple plasmon resonance wavelengths, which nanoantenna is suitable for use in a plasmonic light concentrator arrangement of a thin film photovoltaic cell structure as described above. However, the nanoantenna of the present invention is not limited to be used as a part of a photovoltaic cell structure according to the first aspect of the present invention only.

They can also be used in other plasmonic light concentrator arrangements.

The nanoantenna comprises a unit cell comprising two pairs of first sub-wavelength metal patches placed around a central gap separate from each other, the two first patches of each pair lying on opposite sides of the central gap centrally located on a straight connection line crossing the central gap, the connection lines of the two pairs of sub-wavelength metal patches being directed substantially perpendicularly to each other. In other words, in this embodiment the unit cell comprises at least four first sub-wavelength metal patches located so as to surround a central gap. The two pairs of patches serve for at least two resonance frequencies. In the conventional dimer type and bow-tie nanoantennas, there is only one useful plasmon resonance. For example, in the bow-tie geometry the useful resonance is excited by polarization of incident light along the axis of symmetry connecting the two triangles. There is actually also another plasmon resonance excited by polarization perpendicular to said axis. However, this second resonance occurs at a frequency significantly higher than that of the main antenna resonance and does not result in the formation of the hot spot in the central gap of the antenna. Moreover, at this resonance of a bow-tie nanoantenna, the local field is concentrated inside the triangular nanopatches and is mainly dissipated. With the two pairs of patches according to this embodiment of the present invention, the two resonant frequencies are by nature close to each other and can also overlap, thereby forming effectively a single broad resonance band.

The basic principle of the nanoantenna described above is to implement one single unit cell capable of producing multiple resonant frequencies. Thereby, the need for separate unit cells for different resonant frequencies is avoided, and the unit cell can be made substantially smaller than in the prior art solutions. Generally, the overall size of the nanoantenna should be less than or in the range of the wavelength of the incident light. The width of the unit cell comprising the two pairs of sub-wavelength metal patches, as defined in the direction of any of the connection lines, is preferably less than or equal to 1 μm. This limitation of the maximum unit cell size ensures that the above-described problems of parasitic reflection and transmission of light energy into the substrate can be avoided in the visible and near IR wavelengths covering the most important wavelength range in solar energy applications.

The central gap width as defined in the directions of any of the connection lines is preferably in the range of 50-300 nm. Manufacturing of nanoantenna unit cells with a gap width of below 50 nm could necessitate expensive high resolution equipment and processes like e.g. electron beam lithography. On the other hand, with central gap widths of over 300 nm, the patches of an antenna designed for visible and near infrared wavelengths no more operate properly together so as to form the hot spot in the area of the gap.

In one preferred embodiment, each of the first sub-wavelength metal patches has substantially a shape of an isosceles trapezoid, the shorter base of the trapezoid facing towards the central gap. This shape has been found a good alternative to provide plasmonic resonance frequencies in the near infrared region. In a preferred embodiment optimized for operation around 1 μm and providing efficient field enhancement in a hot spot in the area of the central gap, each of the first sub-wavelength metal patches is formed of gold and has a thickness of 50-100 nm; the width of the central gap along any of the connection lines is 150-250 nm; the lengths of the shorter and longer bases of the trapezoid are 75-150 nm and 200-450 nm, respectively; and the height of the trapezoid is 300-500 nm.

In an alternative preferred embodiment, each of the first sub-wavelength metal patches has an elongated shape having a longitudinal axis of symmetry which is directed substantially perpendicularly with respect to the connection line on which the first patch lays. Elongated patches positioned perpendicularly with respect to the fictitious connection lines are particularly suitable for operation in the visible wavelength range. In an even more preferred embodiment, the unit cell further comprises, for each of the first sub-wavelength metal patches, a second elongated sub-wavelength metal patch lying centrally located on the same connection line on which the first sub-wavelength metal patch lies on the side of the first patch opposite to the central gap, and having a longitudinal axis of symmetry which is directed perpendicularly with respect to this connection line. This configuration thus comprises a total of at least eight sub-wavelength patches placed around the central gap of the unit cell.

In one particularly efficient embodiment of the unit cell comprising the first and the second elongated sub-wavelength metal patches, each of the first and the second sub-wavelength metal patches is formed of gold and has a thickness of 20-50 nm; the width of the central gap along any of the connection lines is 100-150 nm; the lengths of the first and the second sub-wavelength metal patches along the longitudinal axis of symmetry thereof are 100-150 nm and 200-250 nm, respectively; and the widths of the first and the second sub-wavelength metal patches in a direction perpendicular to the longitudinal axis of symmetry thereof are 25-50 nm and 50-100 nm, respectively. With this kind of unit cell configuration, wherein each of the first and the second sub-wavelength metal patches further has substantially an elliptical shape, it is possible to implement a nanoantenna where the plasmon resonances produce a broad combined resonance band covering the majority of the visible wavelength range.

In a preferred embodiment of the thin film photovoltaic cell structure according to the present invention comprising a multi-resonance nanoantenna in the plasmonic light concentrator arrangement, the nanoantenna is a nanoantenna of any of the types and geometries described above.

Preferably, the second dielectric layer of the thin film photovoltaic cell structure according to the present invention is formed of plastic. The main advantages of plastic used in the second dielectric layer relate to the manufacturing aspects. Different plastics with suitable optical properties are available with reasonably low prices, thus enabling cost-efficient manufacturing. Moreover, plastics are available in the form of large sheets suitable for simultaneous manufacturing of a large number of individual solar cells. Suitable plastic materials are e.g. polyethylene, polyamide, polymethyl methacrylate, polytetrafluorethylene, and polystyrene.

A third aspect of the present invention relates to a method for manufacturing a thin film photovoltaic cell structure. The method comprises the steps of: providing a first dielectric layer on a substrate; forming an active layer on the first dielectric layer for generating free charge carriers via a photovoltaic effect; and forming a plasmonic light concentrator arrangement on the active layer for coupling incident light at a first wavelength band into the active layer. In forming the active region, principles and processes as such known in the field of thin film photovoltaics can be used. The basic configuration of the thin film cell can be based on the conventional layer structure with superposed p- and n-type semiconductor layers forming a pn-junction and an active layer located between these two layers. Also, the basic configuration of the cell can be a lateral one having the p- and n-type semiconductor regions at the sides of an active region formed within the active layer.

Conventionally, plasmonic light concentrators are formed directly on the preliminary cell structure comprising the active layer. This means that the active layer and other elements of the preliminary cell structure have to be protected during the formation of the plasmonic light concentrator arrangement. According to the present invention, instead, the step of forming the plasmonic light concentrator arrangement on the active layer comprises forming the plasmonic light concentrator arrangement on a film of a dielectric material which is transparent at the first wavelength band and at a second wavelength band; and attaching the plasmonic light concentrator arrangement together with the film on the active layer such that the film forms a second dielectric layer on the plasmonic light concentrator arrangement. Thus, the plasmonic light concentrator is first fabricated separately from the actual photovoltaic core structure of the solar cell, and then attached to it. As a great advantage, said protection of the active layer and other elements of the preliminary cell structure is not needed.

Further, when fabricating the plasmonic light concentrator arrangement separately, very efficient manufacturing processes enabling low unit costs can be used. It is possible to print the plasmonic light concentrator arrangements of a great number of photovoltaic cells on a flexible film. Printing can be performed even in a roll-to-roll process. The principles of printing an array of metallic nanoantenna structures on flexible films or sheets are discussed e.g. by Kotter et al. in "Solar Nantenna Electromagnetic Collectors", Proceedings of the 2nd International Conference on Energy Sustainability ASME Aug. 10-14, 2008, Jacksonville, Fla., USA, paper ES 2008-54016; and by Kotter et al. in "Theory and Manufacturing Processes of Solar Nanoantenna Electromagnetic Collectors", Journal of Solar Energy Engineering, (2010) 132: 011014.

As another essential feature of the method according to the present invention, the first dielectric layer, the active layer, the plasmonic light concentrator arrangement, and the second dielectric layer are configured to form a resonant cavity for coupling incident light at the second wavelength band into a standing wave confined in the resonant cavity.

Preferably, forming the plasmonic light concentrator arrangement on the film of a dielectric material comprises forming a nanoantenna of any of the types and geometries described above.

The principles of, the advantages achieved by, as well as the preferred details of a photovoltaic cell structure thereby manufactured are discussed above in the context of the first aspect of the present invention.

DETAILED DESCRIPTION OF THE INVENTION

Preferred embodiments of the present invention are described in more detail in the following with reference to the accompanying figures, wherein FIG. 1 illustrates a thin film photovoltaic cell structure according to the present invention;

FIG. 2 shows a plasmonic light concentrator arrangement of the thin film photovoltaic cell structure of FIG. 1;

FIG. 3 shows a nanoantenna forming a part of the plasmonic light concentrator arrangement of FIG. 2;

FIG. 4 represents simulation results of a nanoantenna according to FIG. 3;

FIG. 5 shows a modified version of the nanoantenna geometry of FIG. 3;

FIG. 6 shows another nanoantenna suitable for a plasmonic light concentrator arrangement according to the present invention;

FIG. 7 illustrates manufacturing of a thin film photovoltaic cell structure according to the present invention;

FIGS. 8 and 9 illustrate, as schematic drawings, examples of implementing a thin film photovoltaic cell comprising a thin film photovoltaic cell structure according to the present invention.

The figures are not in scale.

Figure 1:
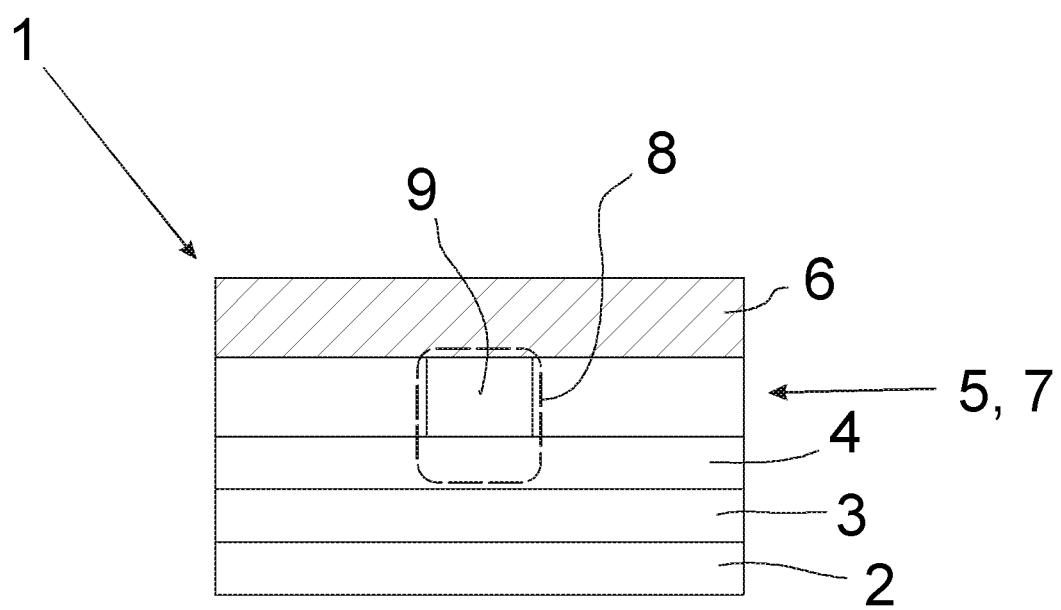

FIG. 1 shows as a cross section a photovoltaic cell structure 1 comprising a wafer carrier 2 serving as a substrate and mechanical support for the photovoltaic cell structure, a first dielectric layer 3 on the wafer carrier 2, and an active layer 4 on the first dielectric layer 3. The active layer 4 of the photovoltaic cell structure 1 can be formed, for instance, of p-doped silicon or p-doped gallium arsenide according to the known principles in the field of thin film photovoltaics. Respectively, the material of the wafer carrier 2 can be any known substrate material suitable for the materials of the first dielectric layer and the active layer formed thereon.

In addition, there is a plasmonic light concentrator arrangement 5 on the active layer 4. The plasmonic light concentrator arrangement 5 is configured to operate at a first wavelength band for coupling incident light at this wavelength band into the active layer 4.

The photovoltaic cell structure 1 of FIG. 1 further comprises a second dielectric layer 6 formed of a dielectric material, e.g. plastic, which is transparent at said first wavelength band to allow light at this wavelength band to enter the structure, and at a second wavelength band.

According to a core principle of the present invention, the materials, layer thicknesses, and other factors affecting the optical performance of the overall layer structure of FIG. 1, including the second dielectric layer 6, are selected to form a Fabry-Perot type standing wave resonant cavity for coupling incident light at a second wavelength band differing at least partially from the first wavelength band into a standing wave confined in the resonant cavity. Most preferably, the first and the second wavelength bands are adjusted to be truly separate so that the wavelength bands where significant improvements in light capturing efficiency take place via plasmonic resonance and Fabry-Perot resonance, respectively, do not overlap.

Thus, the photovoltaic cell structure 1 of FIG. 1 comprises two different arrangements for increasing the efficiency of capturing light into the active layer 4. This combination of two different light coupling arrangements and thus two wavelength bands of enhanced light coupling into the active layer enables an enhanced light capturing efficiency over a broad wavelength range. The actual selection of said materials, layer thicknesses, and other factors affecting the optical performance of the overall layer structure so that such a resonant cavity is formed can be performed, in general, according to common design principles known in the art.

In the following, the selection of the material of the first dielectric layer 3 is shortly discussed a bit more closely. As known for those skilled in the art of thin film optics, one key material parameter in optical layer structures is the permittivity $\epsilon$. The needed permittivity and thickness of the first dielectric layer depends on the choice of the wafer carrier 2. For example, if the wafer carrier is prepared using the SOI technology (silicon on insulator), then the wafer carrier is formed of low-quality amorphous silicon whose relative permittivity $\in_r$ in the frequency region corresponding to the wavelength range of 0.8 to 1.3 micron is close to 9 (see R Swanepoel, J. Phps. E: Sci. Instrum. Vol. 16, 1983), and the attenuation coefficient is relatively high (up to 1/cm) due to the lack of homogeneity. Simulations have shown that the optimum operation of the standing wave resonant cavity, producing the maximum of the field located inside the active layer 4, at wavelengths of 0.8 to 1 micron is achieved with this type of a wafer carrier when the relative permittivity of the first dielectric layer 3 is $\in_r=4$, and the thickness thereof is 200-220 nm. Materials having such relative permittivity include e.g. $SiO_2$ and alumina.

Moreover, the material of the first dielectric layer can also be a semiconductor (pure or weakly doped) having suitable optical properties, particularly a suitable relative permittivity, and sufficiently low absorption losses. There are semiconductors such as copper indium gallium selenide (CIGS) and cadmium telluride (CdTe), the complex permittivity of which and thus the absorption losses strongly depend on the doping level. Pure or even weakly doped semiconductor material of this type is optically equivalent to the truly dielectric materials. In general, any material for which the ratio of the imaginary part to the real part of the complex permittivity is less than or equal to about 0.1, can be regarded as "dielectric" in the sense that such material can be used for the first dielectric layer. An example of this general principle is shown in FIG. 9.

For example, the refraction index of CIGS in the inter-band range 500-1000 nm decreases from 2.2 to 1.9, whereas k=0.1-0.2 (P. D. Paulson, R. W. Birkmire, and W. N. Shafarman, J. Appl. Phys., 879, 94, 2003). This modest dispersion helps to make the Fabry-Perot trapping more broadband. Since the absolute value of the complex permittivity of pure or weakly doped CIGS is of the order 4-5, a contrast with the permittivity of the active layer is achievable which is as high as e.g. for alumina or SiO2.

If the target is to provide a large-area thin film solar cell with a flexible substrate formed of e.g. some polymer, the typical relative permittivity of such substrates of $\in_r=2\ldots 3$, naturally, changes the optimum first dielectric layer material and thickness from the above examples.

It is a very important issue in the present invention that the broadband standing-wave resonator cavity can be obtained with just two simple and cheap dielectric layers with submicron thicknesses, i.e. the second dielectric layer 6 and the first dielectric layer 3, whereas in the prior art approaches reported in the literature either a pair of semi-transparent mirrors (nano-polished silver nano-film) or a pair of Bragg mirrors (periodic multilayers) is used. This simple solution of the present invention is possible because the photovoltaic active layer 4 between those two dielectric layers has a very high relative permittivity (typically over 9), and its optical contrast with the second and the first dielectric layers is high.

Concerning the word "layer" in the context of the first dielectric layer, it has to be noted that in the optical sense, the first dielectric layer operating as a part of the resonant cavity is actually not a true "layer". There is no internal light reflection from the bottom interface of this layer, i.e. from the interface between the first dielectric layer and the substrate. In that sense, the first dielectric layer can be considered as a semi-infinite medium.

The thin film photovoltaic cell structure 1 of FIG. 1 represents a portion of a lateral cell configuration where the p- and n-type semiconductor regions (not shown in FIG. 1) forming the pn-junction of the device are located laterally apart from each other and are in contact with the same side of the active layer 4. The basic principle of the present invention, i.e. the combination of those two types of light coupling arrangements, can be utilized in the more conventional vertical cell configuration as well, where the n- and p-type regions forming the pn-junction are arranged on different sides of the active layer.

Generally, the plasmonic light concentrator arrangement 5 of FIG. 1 can be formed according to the known principles of plasmonic light concentrators. In the example of FIG. 1, the plasmonic light concentrator comprises an array of nanoantennas 7. FIG. 1 is limited to present a portion of a photovoltaic cell structure substantially corresponding to the width of a unit cell 12 of one of the nanoantennas 7. As known in the art, the purpose of a nanoantenna integrated into a photovoltaic cell is to concentrate incident light energy into a hot spot 8 in the antenna gap 9. Due to the difference in the complex permittivity between the gap 9 and the active layer 4 of the photovoltaic cell, the center of the hot spot is displaced from the center of the gap towards the active layer.

FIG. 2 shows an array of nanoantennas 7 formed on a flexible plastic sheet 10 made of, for instance, polyethylene. The nanoantennas are formed by printing gold patches 11 on the plastic sheet 10.

FIG. 3 shows a unit cell 12 of the nanoantennas 7 of the arrangement of FIG. 2. The unit cell 12 comprises four gold patches 11 arranged as two pairs located around a central gap 9. Each pair lies on a connection line 13a, 13b crossing the central gap 9 so that the two gold patches 11 thereof are located centrally on opposite sides of the gap. The two imaginary connection lines 13a, 13b are directed oppositely to each other.

Each of the gold patches 11 has a shape of an isosceles trapezoid and is formed so as to have the shorter base of the trapezoid facing towards the central gap. The thickness $d_A$ of the gold patches 11 can be 50-100 nm, e.g. about 75 nm. The width $w_A$ of the square-form central gap 9 can be about 200 nm, for example. Suitable lengths for the shorter and the longer bases $b_1$, $b_2$ are 100-150 nm and 200-300 nm, respectively.

The height h of the trapezoid preferably lies in the range of 300-500 nm. Thus, the overall width $W_A$ of the unit cell 12 thereby formed can be 800-1000 nm.

With the geometry of FIG. 3, the nanoantenna produces multiple resonance frequencies at near infrared wavelengths. A key factor to enable the multi-frequency operation is the presence of two pairs of patches 11 in the unit cell 12 of the antenna 7. The shape of the patches 11, in turn, contributes to the resonant operation at infrared wavelengths.

FIG. 4 shows simulated local field intensity enhancement in the gap of a nanoantenna, as measured within the active layer below the nanoantenna patches (at the distance of 10 nm from the patches), according to FIG. 3. Graph a) represents the simulated results at 850 nm, whereas graph b) shows the corresponding results for 980 nm. Simulations were performed in the HFSS package (High-Frequency Structure Simulation) for normal incidence of light. Figures a) and b) clearly prove that the nanoantenna operates as intended, i.e. by effectively enhancing the intensity in the gap. For those two wavelengths, the intensity distributions are similar but enhancement factors are different. Maximal intensity enhancement factor in the structure is achieved at 980 nm and is close to 225 (amplitude enhancement 15). The simulations also showed that there is practically no hot spot formation at all within the metal patches of the nanoantenna 7. Thus, the field enhancement very efficiently takes place in the active layer only.

The resonance frequencies according to the nanoantenna 7 of FIG. 3 can be adjusted by modifying the dimensions of the nanopatches 11 and the central gap 9. On the other hand, for each material of the patches 11, the dimensions required for a particular resonant frequency are unique.

The sharp edges of the patches 11 of FIG. 3 are not necessary, but the edges can be smoothed as well without substantially deteriorating the optical performance of the nanoantenna 7. Moreover, it has been found that by making the sides of the trapezoids convex or concave, the resonant frequencies are shifted towards infrared or visible wavelengths, respectively. As an example of the latter, FIG. 5 presents a nanoantenna geometry modified from that of FIG. 3.

The geometry of FIG. 5 differs from that of FIG. 3 in that the sides of the trapezoids are recessed to make the shape of the trapezoid concave. For one particular geometry with the gap width $w_A$ of 200 nm, the lengths of the shorter and the longer bases $b_1$, $b_2$ of 100 nm and 400 nm, respectively, and the width $b_3$ of the trapezoid at the midpoint between the shorter and the longer bases of 300 nm, simulations showed a shift of the central operational frequency of the nanoantenna 7 of from 270-300 THz to 200-240 THz, depending on the material of the film 10 on which the nanoantenna 7 is formed. This corresponds to a shift in the wavelength of from 1.00-1.11 to 1.25 to 1.50 μm. In the simulated geometry, the unit cell width $W_A$ was about 800 nm. This high operation wavelength with such a low size of the nanoantenna is a very interesting combination not achieved, according to the best knowledge of inventor, by any prior art solution.

As an alternative to the two pairs of trapezoids of the unit cell 12 of FIG. 3, FIG. 6 shows a nanoantenna 14 where each of the gold patches 151, 152 have the form of an ellipse. The nanoantenna 14 of FIG. 6 is an example of nanoantenna geometry providing multiple resonances in the visible wavelength range.

As in the geometry of FIG. 3, also the elliptical gold patches 151, 152 of FIG. 6 are arranged as pairs around a central gap 16, each pair lying on one of two fictitious, orthogonally directed connection lines 13a, 13b crossing the central gap 16. The longitudinal axis of symmetry 171, 172 of each patch 151, 152 is directed perpendicularly with respect to the connection line on which the patch lies. Instead of two, there are four pairs of patches 151, 152 in the nanoantenna 14 of FIG. 6. The patches 151, 152 have different sizes so that patches 151 of a first size lie adjacent to the central gap 16, thereby forming an inner circle around it, whereas patches 152 with a larger second size lie behind the patches 151 of the first size.

The elliptical gold patches 151, 152 of FIG. 6 can have a height $d_B$ of 20-50 nm. Suitable lengths $l_1$, $l_2$ of the smaller and larger patches are 100-150 nm and 200-250 nm, respectively. The widths $m_1$, $m_2$ of the smaller and larger patches can be in the ranges of 25-50 and 50-100, respectively. With these dimensions, the overall width $W_B$ of the unit cell 18 can be in the range of 500-600 nm, for example.

The elliptical shape of FIG. 6 is only one example of possible shapes of elongated patches for a nanoantenna operating at visible wavelengths. Also other elongated shapes having a longitudinal axis of symmetry could be used.

It is essential in the nanoantenna geometries of FIGS. 3, 5, and 6 that the different patches 11, 151, 152 of a unit cell 12, 18 are truly separated from each other.

The plasmonic light concentrator arrangement 5, 7 according to FIGS. 1 and 2, as well as plasmonic light concentrator arrangements based on, for example, nanoantennas 7, 14 according to FIGS. 5 and 6, can be manufactured cost-efficiently as large-area sheets. Printing the gold patches 11 forming the nanoantennas 7 can be performed e.g. in a roll-to-roll process. To be used as a part of a thin film photovoltaic cell structure, this sheet with the nanoantennas 7 can then be cut into suitably sized elements according to the size of individual photovoltaic cells or of an array of cells.

FIG. 7 illustrates the principle of incorporating the plasmonic light arrangement 5, 7 thereby formed as a part of a photovoltaic cell structure 1. As in FIG. 1, also the drawings of FIG. 7 are limited to present portions of a photovoltaic cell structure (1) corresponding to the width of a unit cell of one of the nanoantennas 7 only.

In the embodiment of FIG. 7, the volumes 19 between the adjacent patches of the nanoantenna 7 are left empty (air-filled), whereby they form thin cavities in the final photovoltaic cell structure. It is also possible to fill those volumes with some suitable material, if appropriate in some particular embodiment.

In the process illustrated in FIG. 7, a first dielectric layer 3 made of a dielectric material is first formed on a wafer carrier 2, and an active layer 4 is formed on the first dielectric layer. The plastic sheet 10 having the nanoantennas 7 thereon is flipped over and placed on top of the active layer 4 upside down, i.e. with the side of the nanoantennas 7 towards the active layer 4. When the superstrate of the plastic sheet 10 and the nanoantennas 7 thereon is placed on the underneath layer stack by slightly pressing it against the active layer, self-adhesion occurs between the superstrate 10, 7 and the active layer 4. The thickness of the nanoantennas 7, which can be e.g. in the range of 50 to 100 nm, is roughly in the range of one tenth of the thickness of the plastic sheet 10. Therefore, the effect of the air gaps in the volumes 19 on the adhesion between the superstrate 10, 7 and the active layer 4 is, in most cases, insignificant. If appropriate in some particular embodiment, it is also possible to use some intermediate adhesive material between the active layer 4 and the superstrate 10, 7 to ensure sufficient adhesion therebetween. Moreover, the plastic sheet 10 can be additionally fixed to the underneath active layer 4 along the perimeter of the cell area.

As a great advantage of separate fabrication of the nanoantennas 7 on the plastic sheet 10, no protective intermediate layer is needed to protect the active layer as is the case if growing or depositing plasmonic light concentrators directly on the active layer.

In the thereby formed photovoltaic cell structure 1, the plastic sheet 10 forms the second dielectric layer 6 of the structure. After attaching the plastic sheet 10 having the nanoantennas 7 on the active layer 4, the thickness thereof can be reduced to optimize the operation of the resonant cavity. Suitable thickness of the second dielectric layer formed e.g. of polyethylene can be e.g. in the range of 300-800 nm. In many embodiments, the most suitable thickness is 600-800 nm.

FIG. 8 shows a photovoltaic cell building block 20 which can be repeated to form a large area thin film photovoltaic cell. The building block is based on a thin film photovoltaic cell structure comprising a substrate 2, a dielectric layer 3 on the substrate, a p-type active layer 4, and an n-type region 21 which forms a semiconductor path between the substrate 2 and the active layer 4, and covers only a part of the building block area. As a uppermost layer is another, transparent dielectric layer 6. Moreover, the building block comprises conductive vias 22, 23 extending through the substrate to the p-type active layer 4 and to the n-type region 21. These vias enable electrical interface of the building block to be implemented by means of an electrode configuration (not shown in FIG. 8), e.g. in the form of interdigitated electrode geometry, arranged on the back side of the building block. Thereby, the front side, i.e. the side of incident radiation, can be free from any non-transparent structures which would decrease the effective surface area of the cell. So, the entire area of the building block 20 can be covered by a grid of nanoantennas 7 formed on the active layer 4.

FIG. 9 shows another alternative for a building block 24 for a thin film photovoltaic cell. As shown in the cross section A, the building block 24 of FIG. 9 is formed on a flexible substrate 2 allowing formation of a large-area flexible photovoltaic cell. An n-type semiconductor element needed for the pn-junction is implemented as a continuous n-type semiconductor layer 25 below the p-type active layer 4. Moreover, there is a thin insulating layer 26 between the active layer 4 and the nanoantennas 7.

As a specific feature of this example, the n-type semiconductor layer 25 serves as the first dielectric layer forming a part of the standing wave resonator of the structure. The doping level of the n-type semiconductor layer is so low that the absorption losses are insignificant, i.e. they do not disturb said operation as the dielectric layer. The material of the n-type semiconductor layer 25 can be, for example, sufficiently low doped CIGS.

In the building block 24 of FIG. 9, the electrodes to form electrical connections to the p-type and n-type semiconductors lie at different sides of the active layer. A back-side electrode 27 is formed as a continuous metal layer between the flexible substrate 2 and the n-type layer 25. As shown in the top view B and in the cross section A of FIG. 9, a front-side electrode 28 is formed as a metal frame surrounding, and forming an electrical connection to, the p-type active layer 4. The back-side and the front-side electrodes are separated from each other by an insulating frame 29 surrounding the stack of n-type and the p-type layers. In a thin film photovoltaic cell composed of building blocks 24 according to FIG. 9, the front-side electrodes 28 of the building blocks can be formed as a single continuous metal net extending over the entire cell area. Correspondingly, the back-side electrode can be implemented as a single continuous metal layer.

In both of the examples of FIGS. 8 and 9, the dimensions and geometry of the building block satisfy the standard requirement of the efficient current collection, according to which the shortest distance between the p-n junction and the electrode should be smaller than the diffusion length of the carriers. The widths of the building blocks may be e.g. 1 to 3 mm.

Figure 10:
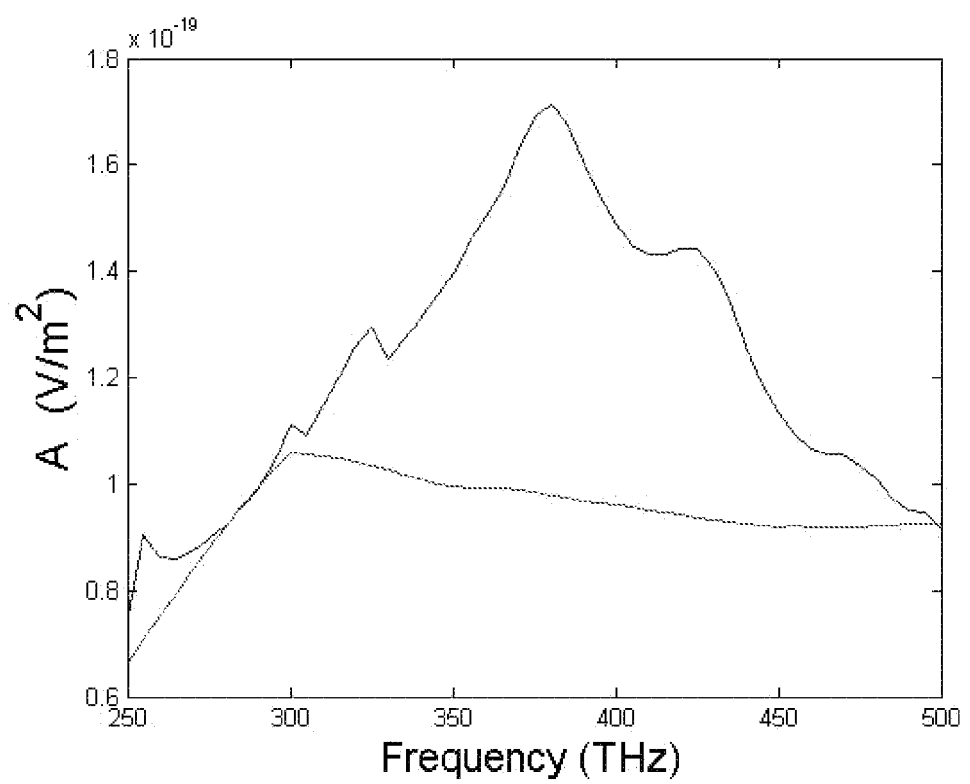
FIG. 10 shows the effect of the present invention to the overall light capturing efficiency of a thin film photovoltaic cell.

The graph of FIG. 10 shows two curves, one (the lower one) simulated for a conventional thin film photovoltaic structure, and another (the upper one) for the same photovoltaic structure having, in accordance with the present invention, a plasmonic light concentrator arrangement based on a nanoantenna according to FIG. 3 combined with a Fabry-Perot resonator formed between the first and the second dielectric layers. As the curves of the graph shows, the present invention provides a huge enhancement of the photovoltaic absorption over a broad wavelength range from about 600 nm (500 THz) to 1.2 μm (250 THz).

The embodiments of the present invention are not limited to examples discussed above but can freely vary within the scope of the claims.

The invention claimed is:

1. A thin film photovoltaic cell structure comprising:
   a substrate;
   a first dielectric layer on the substrate;
   an active layer on the first dielectric layer; and
   a plasmonic light concentrator arrangement on the active layer for coupling incident light at a first wavelength band into the active layer;
   the thin film photovoltaic cell structure further comprising
   a second dielectric layer formed of a material which is transparent at the first wavelength band and at a second wavelength band on the plasmonic light concentrator arrangement; the first dielectric layer, the active layer, the plasmonic light concentrator arrangement, and the second dielectric layer being configured to form a resonant cavity for coupling incident light at the second wavelength band into a standing wave confined in the resonant cavity;
   characterized in that the plasmonic light concentrator arrangement comprises a nanoantenna for concentrating the incident light at the first wavelength band into a spot extending into the active layer, the spot being created due to excitation of the eigenmodes of the antenna unit;
   wherein the nanoantenna comprises a unit cell comprising two pairs of first sub-wavelength metal patches placed around a central gap separate from each other, the two first patches of each pair lying on opposite sides of the central gap centrally located on a straight connection line crossing the central gap, the connection lines of the two pairs of first sub-wavelength metal patches being directed substantially perpendicularly to each other.

2. A nanoantenna suitable for a plasmonic light concentrator arrangement of a thin film photovoltaic cell structure, comprising:
   a unit cell comprising two pairs of first sub-wavelength metal patches placed around a central gap separate from each other, the two first patches of each pair lying on opposite sides of the central gap centrally located on a straight connection line crossing the central gap, the connection lines of the two pairs of first sub-wavelength metal patches being directed substantially perpendicularly to each other.

3. A nanoantenna as defined in claim 2, wherein the central gap width as defined in the direction of any of the connection lines is 50- 300 nm.

4. A nanoantenna as defined in claim 2, wherein each of the first sub-wavelength metal patches has substantially a shape of an isosceles trapezoid, the shorter base of the trapezoid facing towards the central gap.

5. A nanoantenna as defined in claim 4, wherein the thickness of each of the first sub-wavelength metal patches is formed of gold and has a thickness of 50 - 100 nm; the width of the central gap along any of the connection lines is 150-250 nm; the lengths of the shorter and longer bases of the trapezoid are 75-150 nm and 200-450nm, respectively; and the height of the trapezoid is 300-500 nm.

6. A nanoantenna as defined in claim 2, wherein each of the first sub-wavelength metal patches has an elongated shape having a longitudinal axis of symmetry which is directed substantially perpendicularly with respect to the connection line on which the first sub-wavelength metal patch lays.

7. A nanoantenna as defined in claim 6, wherein the unit cell further comprises, for each of the first sub-wavelength metal patches, a second elongated sub-wavelength metal patch lying centrally located on the same connection line on which the first sub-wavelength metal patch lies on the side of the first sub-wavelength metal patch opposite to the central gap, and having a longitudinal axis of symmetry which is directed perpendicularly with respect to this connection line.

8. A nanoantenna as defined in claim 7, wherein each of the first and the second patches is formed of gold and has a thickness of 20-50 nm; the width of the central gap along any of the connection lines is 100- 150 nm; the lengths of the first and the second sub wavelength metal patches along the longitudinal axis of symmetry thereof are 100-150 nm and 200-250 nm, respectively; and the widths of the first and the second sub-wavelength metal patches in a direction perpendicular to the longitudinal axis of symmetry thereof are 25-50nm and 50 -100 nm, respectively.

9. A nanoantenna as defined in claim 8, wherein each of the first and the second sub-wavelength metal patches has substantially an elliptical shape.

10. A thin film photovoltaic cell structure as defined in claim 1, wherein the second dielectric layer is formed of plastic.

11. A method for manufacturing a thin film photovoltaic cell structure comprising the steps of:
  providing a first dielectric layer on a substrate;
  forming an active layer on the first dielectric layer; and
  forming a plasmonic light concentrator arrangement on the active layer for coupling incident light at a first wavelength band into the active layer;
  characterized in that the step of forming the plasmonic light concentrator arrangement on the active layer comprises forming the plasmonic light concentrator arrangement on a film of a dielectric material which is transparent at the first wavelength band and at a second wavelength band; and attaching the plasmonic light concentrator arrangement together with the film on the active layer such that the film forms a second dielectric layer on the plasmonic light concentrator arrangement; wherein the first dielectric layer, the active layer, the plasmonic light concentrator arrangement, and the second dielectric layer are configured to form a resonant cavity for coupling incident light at the second wavelength band into a standing wave confined in the resonant cavity;
  wherein forming the plasmonic light concentrator arrangement on a film of a dielectric material which is transparent at the first wavelength band and at a second wavelength band comprises forming a nanoantenna according to claim 2.

12. A nanoantenna as defined in claim 2, wherein the unit cell width as defined in the direction of any of the connection lines is less than or equal to 1 µm.

* * * * *